United States Patent [19]

Griffioen

[11] Patent Number: 4,542,302

[45] Date of Patent: Sep. 17, 1985

[54] POTENTIAL EQUALIZING APPARATUS

[75] Inventor: G. Griffioen, Lienden, Netherlands

[73] Assignee: Giovanni Mazza, Los Angeles, Calif.

[21] Appl. No.: 521,491

[22] Filed: Aug. 8, 1983

[30] Foreign Application Priority Data

Aug. 9, 1982 [NL] Netherlands ........................ 8203138

[51] Int. Cl.[4] ........................ H02H 3/00; G01R 27/14

[52] U.S. Cl. .................................... 307/326; 340/532; 340/660; 340/664; 324/64; 361/79

[58] Field of Search .................... 307/89, 90, 326–328; 340/531, 532, 537, 660, 664; 361/45, 47–50, 79; 324/62, 64

[56] References Cited

U.S. PATENT DOCUMENTS 4,006,319 2/1977 Gartner ............................. 324/62 X
4,209,741 6/1980 Coby et al. ....................... 324/64 X

*Primary Examiner*—A. D. Pellinen
*Assistant Examiner*—Derek S. Jennings
*Attorney, Agent, or Firm*—Nilsson, Robbins, Dalgarn, Berliner, Carson & Wurst

[57] ABSTRACT

An apparatus for reducing the difference in electrical potential between two electrical conducting objects located a distance from each other in an electrical conducting medium includes an equalizing cable with a predetermined resistance valve detachably connected between the two objects. A current detector is coupled in series with the equalizing cable between the two objects and generates a first output voltage with a value dependent on the equalizing current in the equalizing cable. An instrument lead is also detachably connected between the objects. A voltage detector connected in series with the instrument lead between the objects senses the potential difference between the objects and generates a second output voltage having a value dependent on the sensed potential difference. A processing circuit receives the first and second output voltages and generates therefrom a third output voltage which is coupled to a decision circuit which generates an output signal representative of the deviation in electrical resistance between the objects along the equalizing cable and the predetermined resistance value of the equalizing cable.

17 Claims, 2 Drawing Figures

FIG. 1
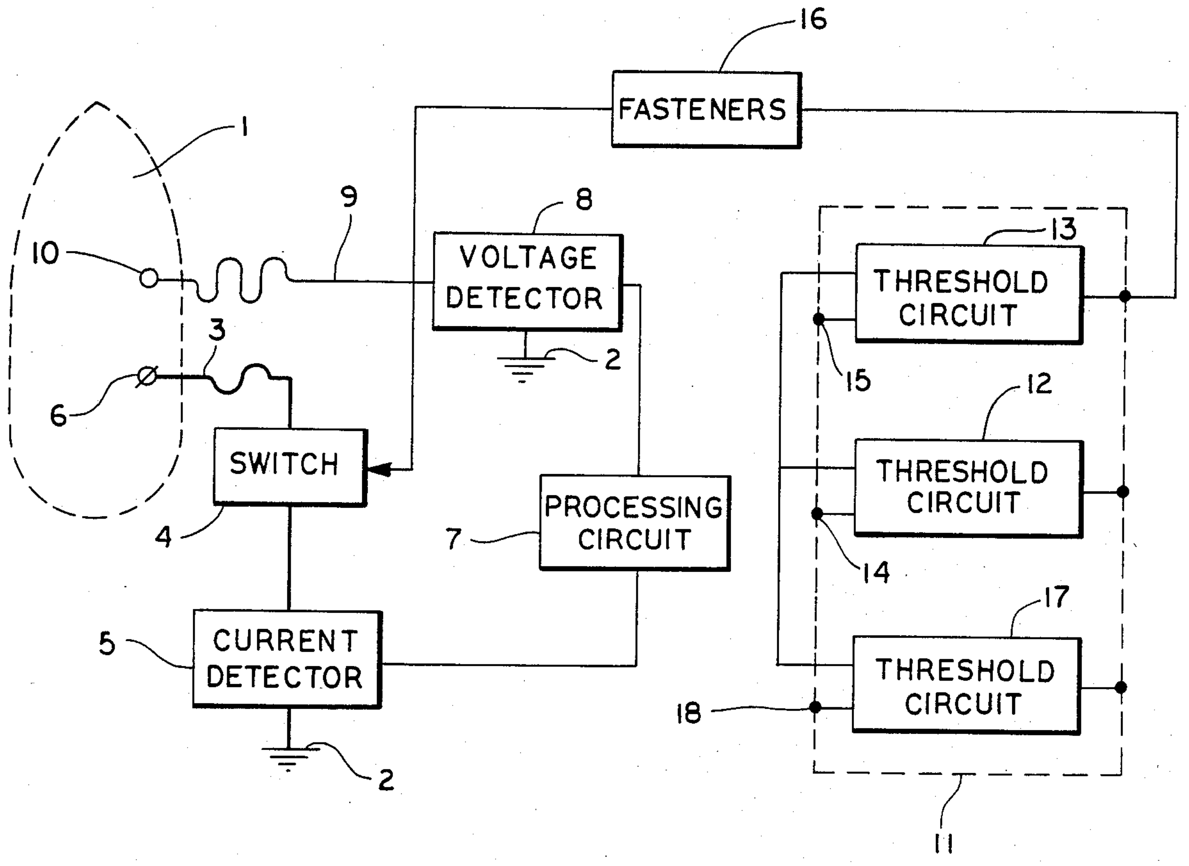
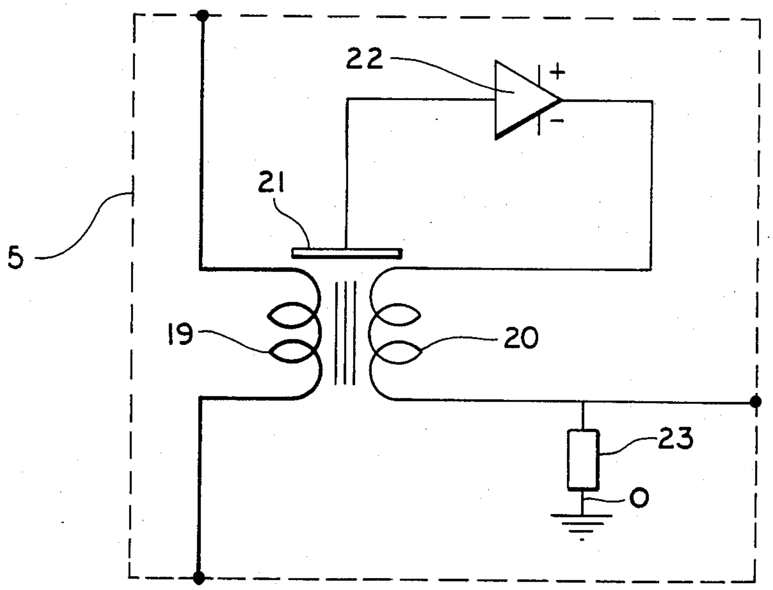
FIG. 2

POTENTIAL EQUALIZING APPARATUS

The invention relates to an apparatus for reducing the difference in electric potential that exists between two electrical-conducting objects which are located a distance from each other in an electrical-conducting medium and which have ions and electrons that are created by different double layers on the exterior walls of the two objects, the apparatus comprises an equalizing cable which can be connected in a detachably way between the electrical-conducting objects and through which an equalizing current passes from one object to the other.

The invention refers specifically to an apparatus in which the objects are ships and/or piers present in conducting water, for example salt water, where light, inflammable liquid are to be transported between the objects by a detachably connected, electrically conducting pipe. If, with such known operating apparatus, the equalizing cable links the ship with the pier and the transport pipe is also placed between them, then, even in the case where an apparatus for cathodically protecting the ship and/or the pier is out of function, the difference in potential will amount to several hundreds mV and the equalizing current will amount to several tens of amperes. In addition the electrical resistance between the connecting points of the equalizing cable has a value on the order of several mΩ. Thus, the contact resistance of the connecting points with the equalizing cable plays an important role.

Although in practice bench screwlike clamps, which are good in themselves, are used for connecting the equalizing cable, accumulated dirt on the contact surfaces during their use cannot always be avoided so that the contact resistances amount to a few tens percent of the resistance of the equalizing cable. Consequently, during the coupling or uncoupling of the transport pipe sparks can result between the coupling parts of the pipe so that a fire or a dangerous explosion can occur. Such a situation can also occur, if the connected transport pipe is damaged after the equalizing cable has been connected.

With the equipment currently in use no objective control can be exercised on the quality of the connection of the equalizing cable before the transport pipe has been connected between the ship and the pier. Therefore, it is recommended on the international level that electrical-isolating couplers in the form of flanges in series with the transport pipe be used. However, in practice a short circuit over such couplers can easily occur. In fact, the application of such couplers is more dangerous than their non-application because of the aforementioned short circuits which can occur at unknown arbitrary moment and thus can occur even after the transport pipe is connected from the ship to the pier, so that during the transporting, sparks can fly and a hazardous fire situation can occur. That the use of the isolating couplers is not generally accepted as a good solution can be seen in that they are not used for inland navigation. The invention deals with eliminating the problems with the known equipment.

According to the invention, the apparatus is characterized by the inclusion of a current detector which is in series with the equalizing cable, and which delivers the first output voltage which is dependent on the equalizer current; an instrument lead which is connected to the objects in series with a voltage detector which can be disconnected where the voltage detector delivers a second output voltage which is dependent on the potential difference; and a processing circuit which delivers a third output voltage which is in turn dependent on the first and second output voltages, whereby the equalizing cable has a predetermined resistance value. By this it is possible to detect a deviation of the nominal resistance value of the equalizing cable, so that it can be judged objectively and from a distance whether, without creating a fire hazardous situation, for example, a transport pipe can be connected between the two objects, or if the connection of the equalizing cable must be tested and if necessary improved upon.

A simple and inexpensive application of the apparatus is achieved if the current detector is made from a current transformer in which the primary winding is inserted in series with the equalizing cable and that with the secondary winding of the transformer a load resistance is connected over which the first output voltage occurs. An added advantage in this application is that a first output voltage can be obtained which is proportional with the equalizer current. This form of application is preferable when the temperature coefficient of the load resistance is substantially equal to that of the equalizing cable and that the load resistance is in such thermal contact with the surroundings of the equalizing cable that its temperature is substantially equal to the ambient temperature around the equalizing cable. In this case, the first output voltage, unaffected by temperature differences between the equalizing cable and the load resistance, is above the present load resistance, so that the making of wrong decisions caused by temperature differences can be avoided.

The processing circuit can be made from a divider circuit which, as a third output voltage, supplies the quotient of the second and the first output voltages. The third output voltage thus equals the product of a constant with the sum of the resistance value of the equalizing cable plus the resistance of the contact from the linked ends of the equalizing cable.

The processing circuit is, however, preferably formed by a subtracting circuit which supplies, as a third output voltage, the difference between the first and the second output voltages, whereby the resistance value of the load resistance is equal to the product of the resistance of the equalizing cable and the conversion ratio of the current transformer. Therefore, the third voltage equals the voltage above the contact resistances at the connecting points of the equalizing cable, so that the decision circuit will decide the quality of the connection of the adjustment cable which is dependent on the difference in potential between the objects. The presence of a high contact resistance will thereby be seen as less dangerous in terms of a relatively smaller difference in potential between the objects.

The apparatus is especially applicable for a system consisting of two objects and a removable mechanical coupler which is connected to the objects by means of a driving force. The coupler, composed mainly of electrical material, is preferably made in such a way so that the driving forces can be sent by a first command signal supplied by the decision circuit, so that the coupler can only be connected or disconnected if, after the equalizing cable is attached, the absolute value of the third output voltage is smaller than a first reference value. If the equalizing cable connection is bad, the coupler, which can be a transport pipe or formed from anchoring cables or towing cables, will not be connected nor disconnected between the objects so that the occurrence of sparks forming at the points of connection of the coupler will not occur.

If the apparatus also in series with the equalizing cable contains a slack-rope switch which is shut after the connecting of the equalizing cable with the objects, then the apparatus is made so that it is brought to an open condition by a second control signal supplied by the decision circuit, if after the switch is shut, the absolute value of the third output voltage is higher than a second reference value. The open condition is maintained afterwards by means of fasteners. In this way the formation of sparks at the connecting points of the equalizing cable, whether it is connected or not, is prevented while the coupler, if it is already connected, cannot be disconnected so that the operator must always try to make the quality of the connection of the equalizing cable as good as possible.

In addition, when the first reference value is smaller than the second reference value, the connecting procedure can be more safely accomplished which is especially important in qualified areas where the shipping of light flammable materials presents a higher risk.

Because the apparatus is especially applicable between ships or between a ship and a pier, it is preferable that the decision circuit be connected with an alarm circuit which is backed-up by a third command signal supplied by the decision circuit, if the absolute value of the third output voltage is higher than a third reference value. In this way, for example, the person who must connect the equalizing cable can be informed easily and from a distance of the quality of the connection to be brought about or of the connection already in use. This information is not affected by the eventual large distances to be covered and will not require the presence of persons who previously had to be present to execute the operations in the correct order for such a connection and who had to communicate with the afore-mentioned person.

BRIEF DESCRIPTION OF THE DRAWINGS

The invention is illustrated by means of the following figures:

FIG. 1 is an illustration of the apparatus according to the invention;

FIG. 2 is an illustration of a working example of the current detector of FIG. 1.

DESCRIPTION OF THE PREFERRED EMBODIMENTS

In what follows, the objects considered are a tanker 1 and a pier 2. Not shown is a transport pipe from the pier 2 to the ship 1 which may be connected for the transport of, for example, light flammable materials.

By means of an equalizing cable connected between ship 1 and pier 2 the equalizing of the difference of potential between the ship and the pier is attempted. At the side of the pier 2, placed in series with the equalizing cable 3, are a slack-rope switch 4 and a current detector 5. The other end of the equalizing cable 3 can be connected for example by means of a clamping screw 6 which is connected to ship 1.

Before the equalizing cable 3 is connected with clamp 6, the slack-rope switch is opened, so that in the area around clamp 6 which is a very high risk area, no sparks flying about should occur during the actual connecting between the equalizing cable 3 and the clamp 6. After the connection, the quality of which is unknown, takes place, switch 4 is closed so that an equalizing current can flow. Previously the transport pipe was connected with ship 1 in an area with a higher risk factor than that close to clamp 6, which could have led to very dangerous situations if the contact resistance close to clamp 6 was so high that a sufficiently large equalizing current was allowed to pass to bring the difference in potential between ship 1 and pier 2 to nearly zero volts.

Consequently, to avoid such dangerous situations, according to the invention, a current detector 5 supplies an output signal dependent on the equalizing current to a processing circuit 7 which receives, on another input, an output signal from voltage detector 8, this signal being dependent on the difference in potential whereby the input of the voltage detector 8 via an instrument lead 9 and a clamp 10 is connected with ship 1. The voltage detector 8 has a high input resistance so that the resistance of the instrument lead 9 and the contact resistance close to clamp 10 is negligible when measuring the difference in potential.

The processing circuit 7 supplies a third output signal to a decision circuit 11 with the aid of which the operator can obtain an indication about the quality of the connection of the equalizing cable 3 with ship 1 and from that reading he can attempt to improve the quality of connection or can decide whether or not to connect the transport pipe with the ship 1. The decision circuit 11 may include one or more threshold circuits such as threshold circuits 12 and 13 which compare objectively the absolute value of the output signal of the processing circuit 7 with a first and a second reference value that are connected to clamps 14 and 15 respectively. The output signal from the threshold circuit 12 can be coupled to effect removal and/or connection of the transport pipe and open the slack-rope switch 4.

The transport pipe, in addition, can only be connected and disconnected respectively with the ship 1 if the third output signal which is supplied by the processing circuit 7 is smaller than the first reference value which is sent to the clamp 14 of the threshold circuit 12. If the third output signal of the processing circuit 7 is higher than the reference value which is conducted to the clamp 15 of the threshold circuit 13, then the slack-rope switch 4 is opened by a command signal coming from the threshold circuit 13, so that if the transport pipe is disconnected this pipe cannot be reconnected until the quality of the connection of the equalizing cable 3 with ship 1 is improved and that in case the transport pipe is already connected to the ship there can be no flying sparks in the area of clamp 6. The first reference value is preferably smaller than the second reference value, while fasteners 16 are present for maintaining the open state of the slack-rope switch 4 after its opening by a command signal coming from the threshold circuit 13.

The decision circuit 11 includes a third threshold circuit 17 which compares the output signal supplied by the processing circuit 7 with a third reference value offered on an input clamp 18. The output of the threshold circuit 17 is connected with an alarm circuit (not shown) such as one formed by acoustic and optic signal-givers, so that a person located on ship 1 can immediately obtain an indication without involving others as to the completed connection of the equalizing cable 3 with the clamp 6.

FIG. 2 shows a working model of the current detector 5 of the apparatus according to FIG. 1. This current detector includes a transformer with a primary winding 19 and a secondary winding 20. The primary winding 19 is connected in series with the equalizing cable 3. A sensor 21 detects the generated field in the transformer and supplies an input signal from it to a current generator 22, which conducts a current through a series switch of the secondary winding 20 and a resistance 23 so that the generated field of the equalizing current in the transformer is compensated by the current of the secondary winding 20. The current of the secondary winding is therefore equal to the equalizing current of the primary winding divided by the winding ratio or conversion ratio of the transformer so that the voltage is greater than the resistance 23 which forms the first output voltage which is conducted to the transforming circuit and is proportional with the equalizing current. The resistance 23 may be a load resistor made of bismuth or an alloy of about 50% iron and 50% nickel or any other suitable material.

The temperature coefficient of the resistance 23 is preferably equal to that of the equalizing cable 3, in which the resistance 23 is added in such a way with relation to the equalizing cable 3 so that they both substantially have the same temperature. The voltage above the resistance 23 is then independent of changes in resistance as a result of a change in the temperature of the surroundings of the resistance 23 and of the equalizing cable 3 respectively so that the third output voltage is also independent of the temperature of the surroundings.

The resistance 23 can be attached to the inner surface of a box for the current detector 5 which is located in the same environment as the current detector 5. The resistance 23 can also be made of a conductor which is attached, in an isolated manner, over a certain length of the equalizing cable 3.

The transforming circuit 7 can be formed by a divisor which divides the second output voltage supplied by the voltage detector 8 from the first output voltage supplied by the current detector 5 so that the third output voltage supplied by the processing circuit 7 equals the product of a constant multiplied by the sum of the resistance values at the clamp 6. The resistance value of the equalizing cable 3 will be known so that an absolute measurement of the contact resistance of clamp 6 is made. The making of decisions based on the contact resistance that is measured with the help of the decision circuit 11 is not totally satisfying because the same measured result occurs for various differences in potential between the ship 1 and the pier. It is thus possible that in a case where the difference in potential between the ship 1 and the pier is negligibly small, nevertheless the application of driving force would unnecessarily prevent the connecting of the transport pipe between the ship 1 and the pier 2.

The processing circuit 7 is thus preferably formed by a subtracting circuit which, as a third output voltage, supplies the difference between the first and the second output voltages to the decision circuit. If, in addition, the resistance value of the resistance 23 is equal to the product of the resistance value of the equalizing cable 3 and the winding porportion of the current transformer, then this equals the third output voltage which is supplied by the processing circuit 7 and this, in turn, is equal to the voltage above the contact resistance on clamp 6. With a higher difference in potential between the ship 1 and the pier, the third output voltage supplied by the processing circuit 7 will be greater in value, which is desired, because then the danger of flying sparks with the coupling or uncoupling of, for example, a transport pipe between the ship 1 and the pier will also be greater. The decision circuit 11 can objectively make the diverse decisions by only adjusting once the reference values which are connected to the clamps 14, 15, and 18. By using another, longer equalizing cable 3, only the value of the resistance 23 is proportionally changed, either becoming larger or smaller. Because no dividing of voltages is performed, the use of a subtracting circuit has an added advantage in that the decision circuit 11 can determine the poor quality of the connection of the equalizing cable 3 if for some reason or another either cable 3 or 9 is not yet connected with ship 1.

The apparatus functions through the application of the subtracting circuit in such a way that the difference of potential between the ship 1 and the pier, when there is no contact resistance on clamp 6, is equal to the first output voltage supplied by the current detector 5 so that the processing circuit 7 together with the voltage detector 8 can simply be formed by the differential amplifier.

The equalizing cable 3 will generally be made of copper with a temperature coefficient of 0.004 1/°C. and a resistivity resistance of $0.0175\times10^{-6}$ Ωm. For example, if we used a cable with a length of 40 m, a cross-section of 120 mm$^2$, in an ambient temperature of 20° C., the resistance of the equalizing cable 3 would be 5.5 Ωm. To achieve a better system, preference would be given to an alloy of approximately 50% iron and approximately 50% nickel which is available commercially under the name of Niron 52. This alloy has a temperature coefficient of 0.004 1° C. and a resistivity resistance of $0.432\times10^{-6}$ Ωm. Using the subtracting unit for the processing circuit 7 and also with a winding proportion of, for example, 1000 of the transformer, the resistance 23 made in that alloy has a value of 5.5Ω and thus also has a length/cross-sectional area ratio of $12.73\times10^{-6}$. A wire made of that alloy with a length of 6.37 m and a cross-sectional area of 0.5 mm makes then an especially efficient resistance 23, a preferable choice for an apparatus with temperature compensation and with the subtracting circuit. The resistance value of the equalizing cable 3 changes approximately 16% with a temperature difference of 40° C. These uncompensated changes in the processing circuit and in the decision circuit 11 produce measuring errors and without an application of temperature compensation by means of an efficient resistance 23, it would make the equipment unreliable, or only efficient in certain ambient temperatures of the equalizing cable 3.

What is claimed is:

1. An apparatus for reducing the difference in electrical potential between two electrical conducting objects located a distance from each other in an electrical conducting medium comprising:

an equalizing cable detachably connected between the two objects for conducting an equalizing current from one object to the other, the equalizing cable having a predetermined resistance value and a temperature coefficient;

a current detector coupled in series with the equalizing cable between the two objects for generating a first output voltage having a value dependent on the equalizing current in the equalizing cable;

an instrument lead detachably connected between the objects;

a voltage detector connected in series with the instrument lead between the objects for sensing the potential difference between the objects and generating a second output voltage having a value dependent on the sensed potential difference;

a processing circuit coupled to receive the first and second output voltages and generate therefrom a third output voltage; and a decision circuit coupled to the third output voltage for generating an output signal representative of the deviation in electrical resistance between the objects along the equalizing cable and the predetermined resistance value of the equalizing cable.

2. The apparatus of claim 1 wherein the current detector comprises:

a transformer having a primary winding coupled in series to the equalizing cable, and a secondary winding; and a load resistor having a temperature coefficient, the load resistor coupled between a base reference voltage and one lead of the secondary winding, the first output voltage being generated at the one lead of the secondary winding.

3. The apparatus of claim 2 wherein the value of the load resistor is selected to be substantially equal to the product of the predetermined resistance of the equalizing cable and the ratio of primary and secondary windings of the transformer.

4. The apparatus of claim 2 wherein the temperature coefficient of the load resistor is substantially equal to the temperature coefficient of the equalizing cable.

5. The apparatus of claim 4 wherein the load resistor is made of bismuth.

6. The apparatus of claim 4 wherein the load resistor is made of an alloy consisting of about 50% iron and 50% nickel.

7. The apparatus of claim 1 wherein the processing circuit comprises a divider circuit whereby the third output voltage is substantially equal to the quotient of the second and first output voltages.

8. The apparatus of claim 2 wherein the processing circuit comprises a divider circuit whereby the third output voltage is substantially equal to the quotient of the second and first output voltages.

9. The apparatus of claim 1 wherein the processing circuit comprises a subtracting circuit and the third voltage signal is substantially equal to the difference between the first and second voltage signals.

10. The apparatus of claim 2 wherein the processing circuit comprises a subtracting circuit and the third voltage signal is substantially equal to the difference between the first and second voltage signals.

11. The apparatus of claim 1 further comprising:

a coupling piece for detachably connecting the equalizing cable to a selected one of the objects, and driving means for effecting electrical connection between the coupling piece and the one object, the driving means coupled to the decision circuit for being responsive to the output signal therefrom to selectively couple and uncouple the coupling piece to the one object.

12. The apparatus of claim 1 wherein the decision circuit is further coupled to a first voltage reference, the decision circuit comprising:

a first threshold circuit coupled to the third output voltage and to the first voltage reference for generating the output signal only if the absolute value of the third output voltage is smaller than the first voltage reference.

13. The apparatus of claim 1 further comprising safety switch means coupled in series in the equalizing cable, the safety switch coupled to the output signal from the decision circuit for being responsive thereto.

14. The apparatus of claim 12 further comprising safety switch means coupled in series in the equalizing cable, the safety switch coupled to the output signal from the decision circuit for being responsive thereto.

15. The apparatus of claim 14 further comprising a second voltage reference, latch means coupled to the safety switch for maintaining the switch in an open, non-conducting position, the decision means comprising a second threshold circuit connected to the third output voltage and the second voltage reference, the latch means coupled to the decision means for maintaining the switch in the open position so long as the absolute value of the third output voltage is greater than the second reference voltage.

16. The apparatus of claim 15 wherein the voltage of the first voltage reference is smaller than the voltage of the second voltage reference.

17. The apparatus of claim 12 further comprising an alarm circuit coupled to the decision circuit for generating an alarm in response to the output signal.

* * * * *